United States Patent
Liu et al.

(10) Patent No.: US 10,154,620 B2
(45) Date of Patent: Dec. 11, 2018

(54) MANUFACTURING METHOD OF CASING

(71) Applicant: Wistron Corporation, New Taipei (TW)

(72) Inventors: Li-Wei Liu, New Taipei (TW); Liang Yu, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 15/297,119

(22) Filed: Oct. 18, 2016

(65) Prior Publication Data
US 2017/0042071 A1 Feb. 9, 2017

Related U.S. Application Data

(62) Division of application No. 13/972,918, filed on Aug. 22, 2013, now Pat. No. 9,510,492.

(30) Foreign Application Priority Data

Jul. 25, 2013 (TW) .............................. 102126706 A

(51) Int. Cl.
*H05K 5/02* (2006.01)
*H05K 13/00* (2006.01)
(Continued)

(52) U.S. Cl.
CPC ........... *H05K 13/00* (2013.01); *G06F 1/1658* (2013.01); *G06F 1/1662* (2013.01); *G06F 1/203* (2013.01);
(Continued)

(58) Field of Classification Search
CPC .. H05K 13/0023; H05K 5/0247; G06F 1/203; G06F 1/1662; G06F 1/1658;
(Continued)

(56) References Cited

U.S. PATENT DOCUMENTS

| 5,581,443 A | * | 12/1996 | Nakamura | ............ | G06F 1/1616 |
| | | | | | 257/712 |
| 8,144,461 B2 | * | 3/2012 | Lin | .......................... | A45C 5/02 |
| | | | | | 361/679.55 |

(Continued)

FOREIGN PATENT DOCUMENTS

TW M451651 4/2013

OTHER PUBLICATIONS

"Office Action of China Counterpart Application", dated Oct. 10, 2016, p. 1-p. 10, in which the listed references were cited.

*Primary Examiner* — Bayan Salone
(74) *Attorney, Agent, or Firm* — JCIPRNET

(57) ABSTRACT

A manufacturing method of a casing is provided. First, a plate, a frame and a main shell are provided, wherein the plate has an adhering region and at least one thermal fusion region, and the frame has a first surface and a second surface opposite to each other. Then, the plate is stacked on the first surface of the frame, wherein the thermal fusion region is overlapped with the frame, and the adhering region is not overlapped with the frame. The main shell is adhered to the adhering region of the plate and the second surface of the frame. The thermal fusion region is fixed to the frame by thermal fusion. In addition, a casing manufactured through the above-mentioned method is also provided.

8 Claims, 9 Drawing Sheets

(51) Int. Cl.
 *G06F 1/16* (2006.01)
 *G06F 1/20* (2006.01)
(52) U.S. Cl.
 CPC ...... *H05K 5/0247* (2013.01); *Y10T 29/49963* (2015.01); *Y10T 29/49964* (2015.01); *Y10T 29/49966* (2015.01)
(58) Field of Classification Search
 CPC ......... Y10T 29/49963; Y10T 29/49964; Y10T 29/49966
 USPC ....... 29/525.11–525.13; 361/679.08, 679.09, 361/679.55, 679.56
 See application file for complete search history.

(56) References Cited

U.S. PATENT DOCUMENTS

| | | | | |
|---|---|---|---|---|
| 8,811,003 B1* | 8/2014 | Hayashida | ............ | G06F 1/1662 361/679.08 |
| 2007/0158221 A1* | 7/2007 | Lin | ............ | A45C 5/02 206/320 |
| 2012/0026662 A1* | 2/2012 | Tanaka | ............ | G06F 1/1616 361/679.08 |
| 2014/0146445 A1* | 5/2014 | Lai | ............ | G06F 3/0213 361/679.1 |

* cited by examiner

MANUFACTURING METHOD OF CASING

CROSS-REFERENCE TO RELATED APPLICATION

This application is a divisional application of U.S. application Ser. No. 13/972,918, filed on Aug. 22, 2013, which claims the priority benefit of Taiwan application serial no. 102126706, filed on Jul. 25, 2013. The entirety of the above-mentioned patent application is hereby incorporated by reference herein and made a part of specification.

BACKGROUND

Field of the Invention

The invention generally relates to a manufacturing method of a casing, and more particularly to a manufacturing method of a casing of an electronic device.

Description of Related Art

Thanks to advances in semiconductor devices and display technology, electronic devices have been continuously developed to be compact, capable of performing multiple functions, and easy to carry. Common portable electronic devices include tablet PCs, smart phones, notebook computers, and so forth. Notebook computers have the same functions as desktop computers, and are thus popular in the consumer market of electronic products.

With a trend toward lightweight and slimness in the design of notebook computers, casings of main units of some notebook computers are manufactured by processing a single metal workpiece (such as aluminum material) by means of a milling process. However, in terms of the manufacture of the casings by means of milling, a huge number of processing machines are required, and moreover, problems such as slower processing speed, lower yield, and little feasibility of mass production may occur. Therefore, how to use a composite process as a replacement for the conventional milling process in manufacturing the casings of main units of notebook computers is currently an important topic in this field.

SUMMARY OF THE INVENTION

The invention provides a manufacturing method of a casing, which simplifies the manufacture of the casing and endows the casing with good structural strength.

The manufacturing method of a casing of the invention includes the following steps. First, a plate, a frame and a main shell are provided, wherein the plate has an adhering region and at least one thermal fusion region, and the frame has a first surface and a second surface opposite to each other. Next, the plate is stacked on the first surface of the frame, wherein the thermal fusion region is overlapped with the frame, and the adhering region is not overlapped with the frame. The main shell is adhered to the adhering region of the plate and the second surface of the frame. The thermal fusion region is fixed to the frame by thermal fusion.

In one embodiment of the invention, the plate has a plurality of screw holes, and the manufacturing method further includes screwing an electronic module to the plate via the screw holes.

In one embodiment of the invention, the electronic module is a keyboard. The keyboard has a plurality of keys. The plate has a plurality of first openings. The main shell has a plurality of second openings. The step of adhering the main shell to the plate includes aligning the second openings respectively with the first openings. The step of screwing the electronic module to the plate includes aligning the keys respectively with the first openings.

In one embodiment of the invention, the manufacturing method further includes the following steps. Before the main shell is adhered to the adhering region, a thickness of a portion of the main shell is reduced, wherein the portion of the main shell corresponds to the adhering region.

In one embodiment of the invention, the step of reducing the thickness of the portion of the main shell includes a milling process.

In one embodiment of the invention, the step of adhering the main shell to the adhering region of the plate and the second surface of the frame includes the following steps. A first adhesive material is provided on the adhering region. A second adhesive material is provided on the main shell. The plate and the frame are covered with the main shell, so that the first adhesive material contacts the main shell and the second adhesive material contacts the second surface of the frame. The plate and the frame are thermally pressed to the main shell.

In one embodiment of the invention, the step of providing the first adhesive material on the adhering region includes the following step. Before the plate is stacked on the frame, the first adhesive material is provided on the adhering region.

In one embodiment of the invention, the thermal fusion region has a plurality of apertures, the frame has a plurality of thermal fusion bosses, and the step of fixing the thermal fusion region to the frame includes the following steps. The thermal fusion bosses are inserted respectively through the apertures. When the thermal fusion bosses are inserted respectively through the apertures, each of the thermal fusion bosses is thermally fused so as to be fixed to the plate.

Based on the above, the casing of the invention mainly consists of the plate, the frame and the main shell, wherein the adhering region of the plate is not overlapped with the frame, and the thermal fusion region of the plate is overlapped with the frame. Accordingly, the frame and the adhering region of the plate may be fixed to the main shell by adhesion. Furthermore, the thermal fusion region of the plate may be fixed to the frame by thermal fusion, thus providing the casing with good structural strength. As described above, the casing of the invention is manufactured by combining the plate, the frame with the main shell in a composite process (including adhesion and thermal fusion) instead of using a milling process that takes more time and effort. Therefore, the manufacturing of the casing is effectively improved in processing speed and yield, thereby reducing the manufacturing cost and facilitating mass production of the casing.

To make the above features and advantages of the invention more comprehensible, embodiments accompanied with drawings are described in detail as follows.

DETAILED DESCRIPTION OF DISCLOSED EMBODIMENTS

Figure 1:
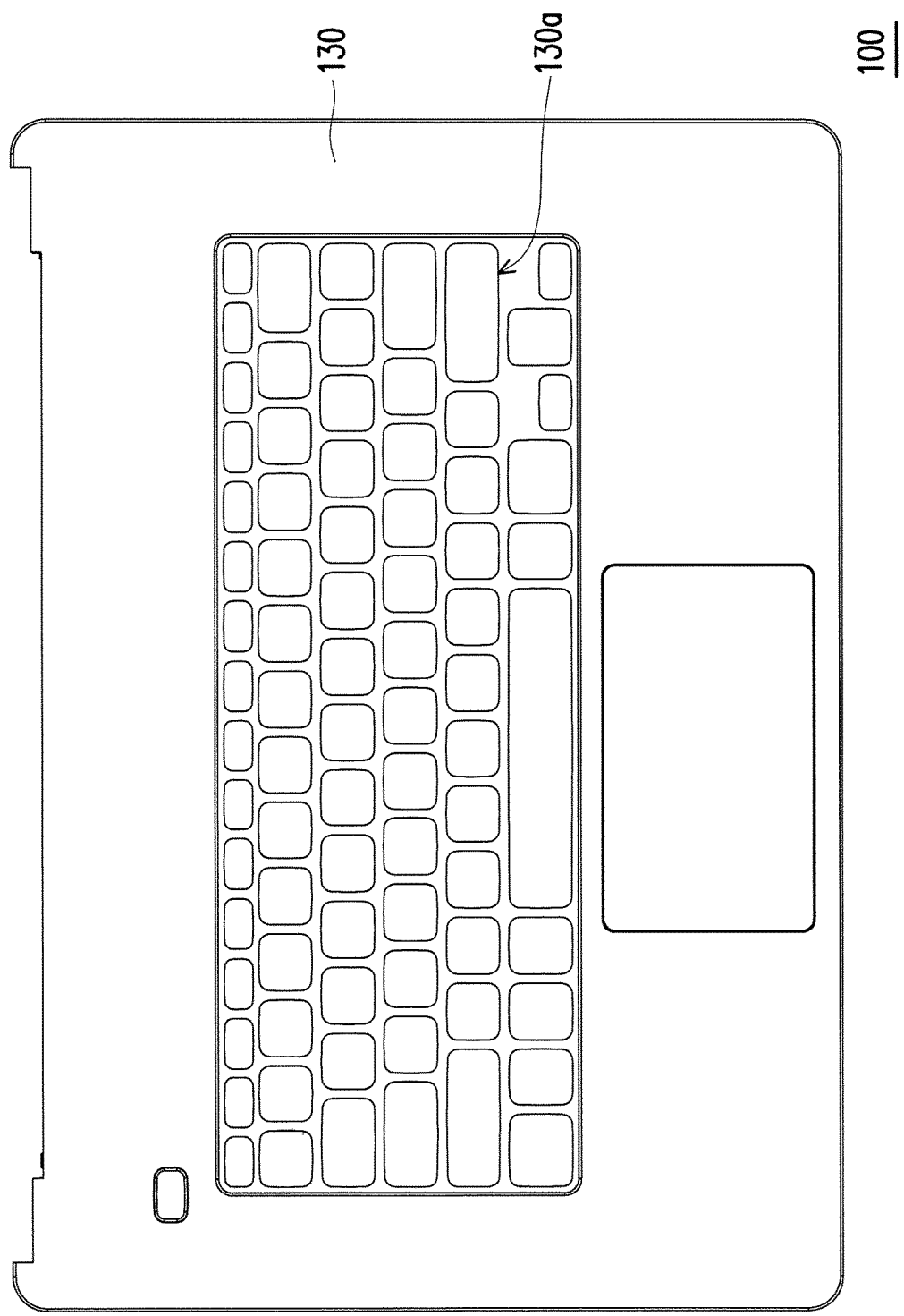
FIG. 1 is a top view of a casing according to an embodiment of the invention.
Figure 2:
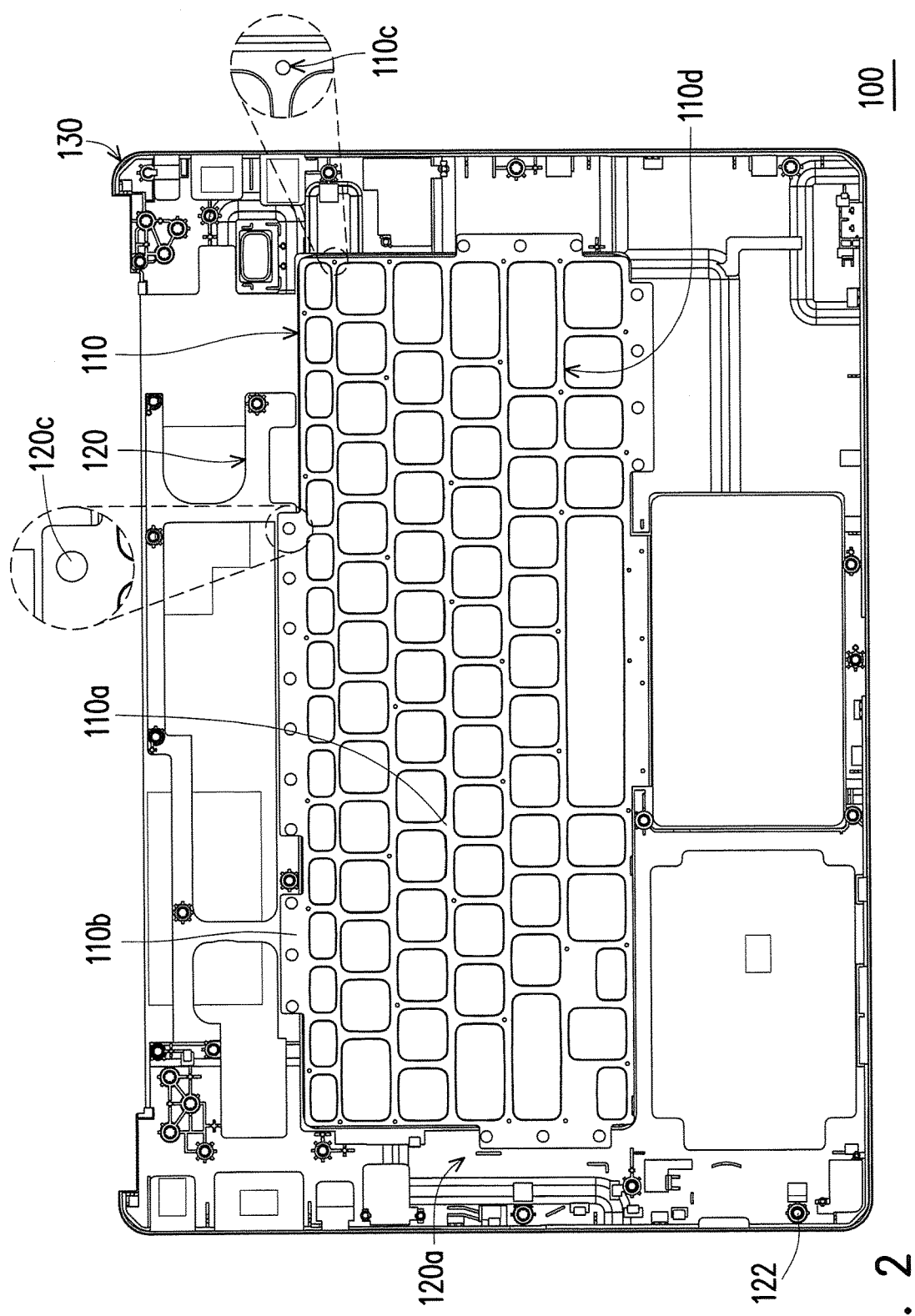
FIG. 2 is a bottom view of the casing in FIG. 1.
Figure 3:
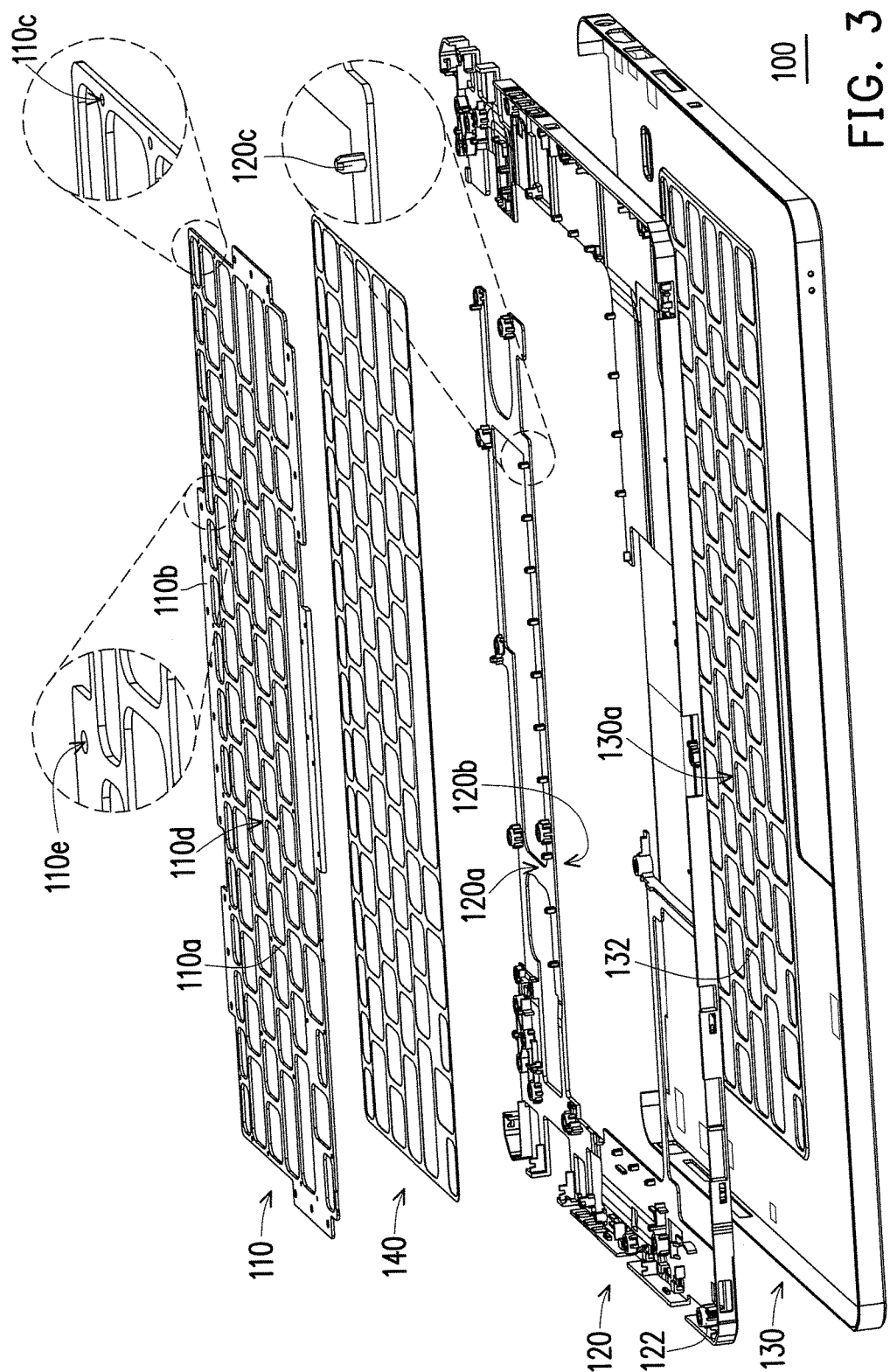
FIG. 3 is an exploded view of the casing in FIG. 1.

FIG. 1 is a top view of a casing according to an embodiment of the invention. FIG. 2 is a bottom view of the casing in FIG. 1. FIG. 3 is an exploded view of the casing in FIG. 1. Please refer to FIG. 1 to FIG. 3. In the present embodiment, a casing 100 is a casing of a main unit of a notebook computer, for example, and includes a plate 110, a frame 120 and a main shell 130. The plate 110 has an adhering region 110a and at least one thermal fusion region 110b (a plurality of thermal fusion regions 110b are illustrated in the drawings). The frame 120 has a first surface 120a and a second surface 120b opposite to each other. The plate 110 is stacked on the first surface 120a of the frame 120, wherein the thermal fusion region 110b of the plate 110 is connected to a periphery of the adhering region 110a and is fixed to the frame 120 by thermal fusion. The main shell 130 is adhered to the adhering region 110a of the plate 110 and the second surface 120b of the frame 120. The frame 120 has an assembling portion 122 for being assembled with other shells of the notebook computer.

Figure 4:
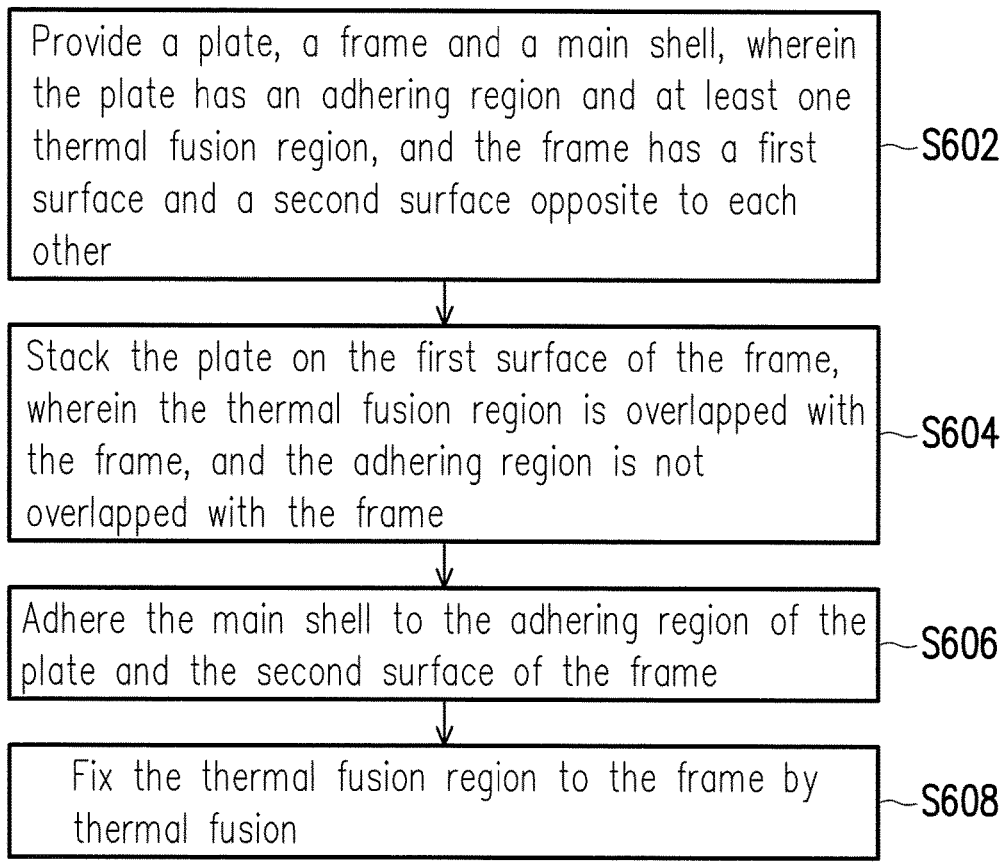
FIG. 4 is a flowchart illustrating a manufacturing method of the casing in FIG. 1.
Figure 5A:
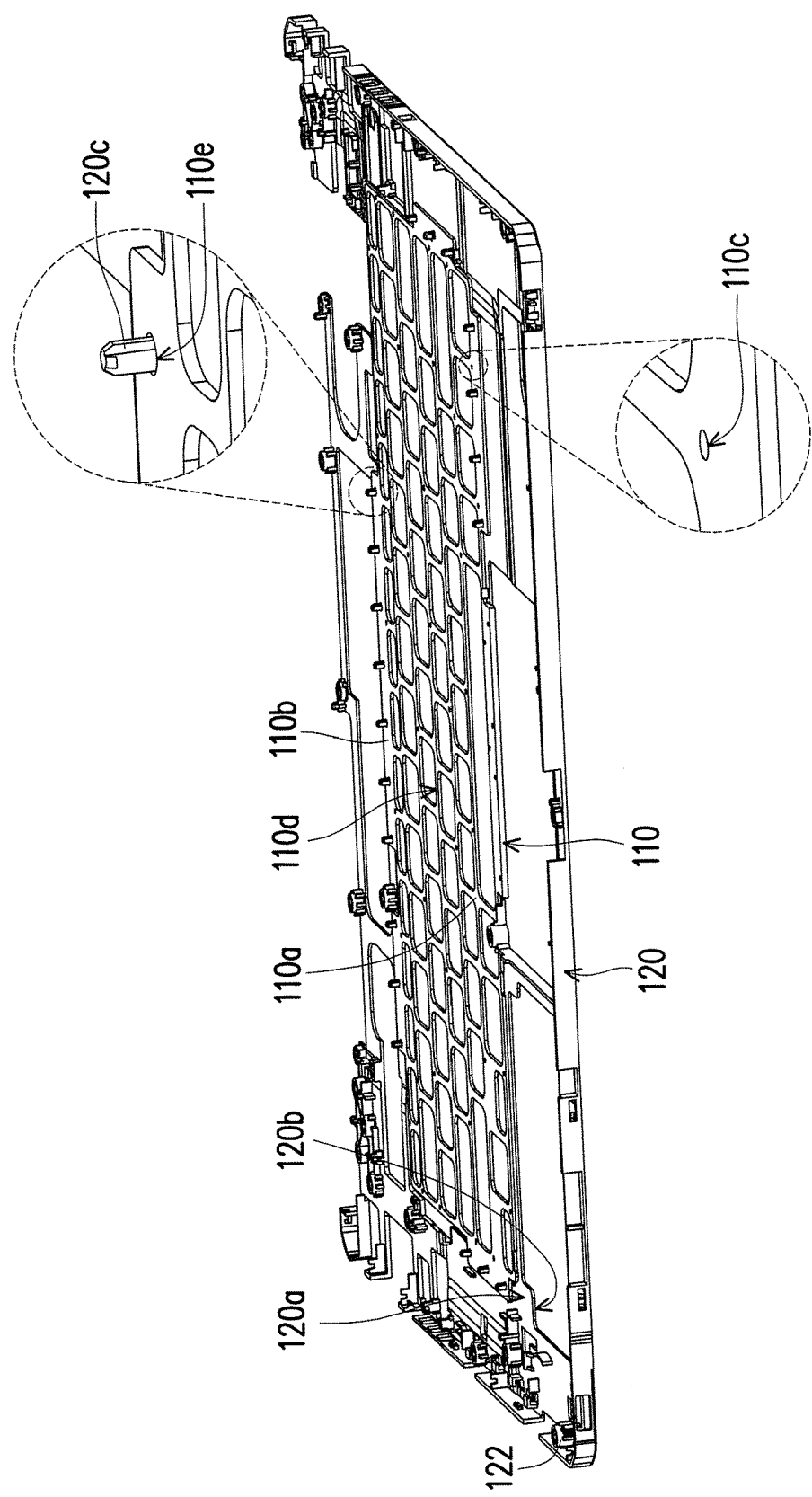
FIG. 5A and FIG. 5B illustrate a manufacturing process of the casing in FIG. 1.
Figure 5B:
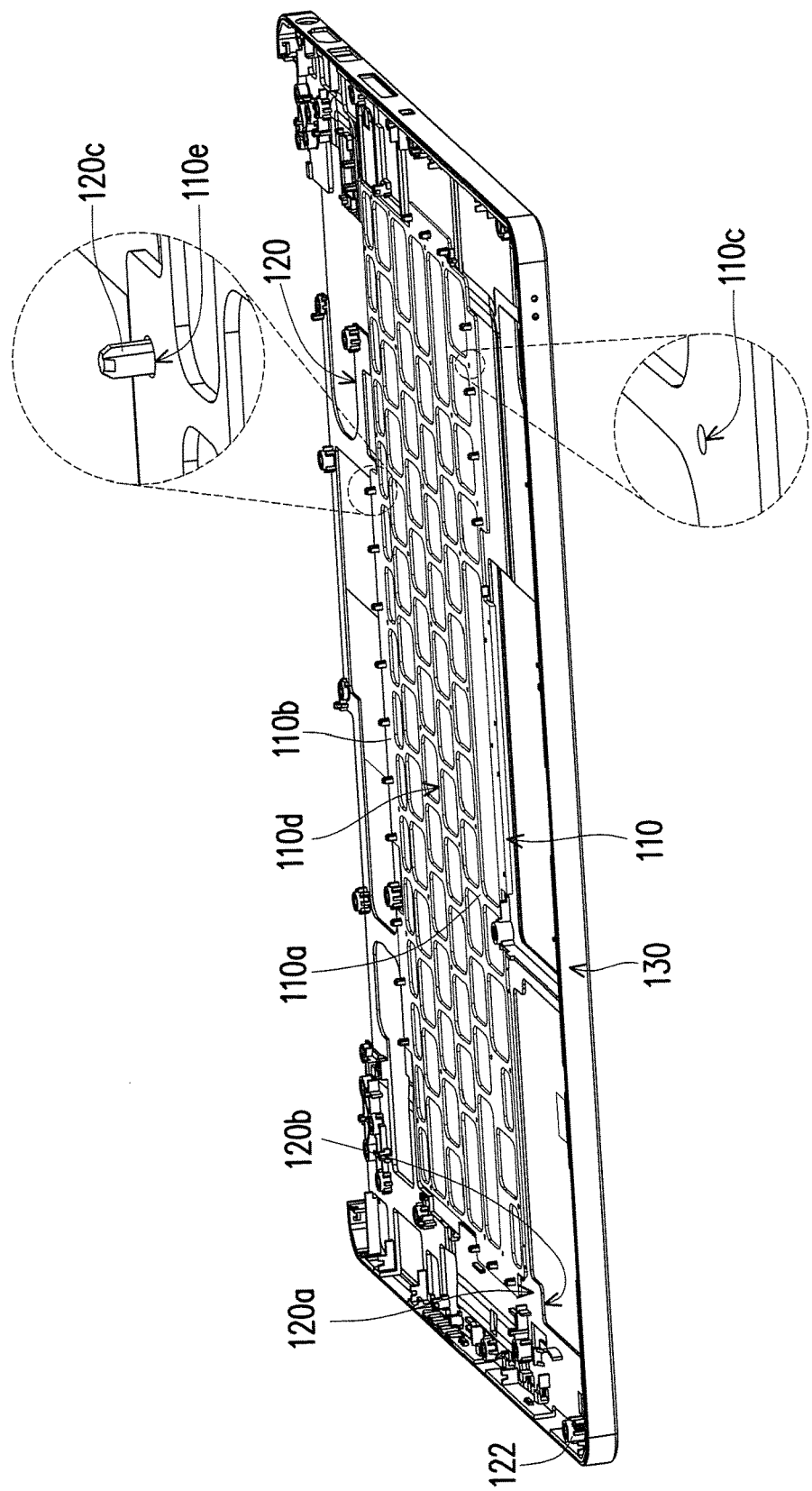

Instead of being manufactured by processing a single metal workpiece (such as aluminum material), the casing 100 in the present embodiment is manufactured by means of a composite process. Details thereof are as follows. FIG. 4 is a flowchart illustrating a manufacturing method of the casing in FIG. 1. FIG. 5A and FIG. 5B illustrate a manufacturing process of the casing in FIG. 1. Please refer to FIG. 4. First, the plate 110, the frame 120 and the main shell 130 shown in FIG. 3 are provided, wherein the plate 110 has the adhering region 110a and at least one thermal fusion region 110b, and the frame 120 has the first surface 120a and the second surface 120b opposite to each other (step S602). Next, as shown in FIG. 5A, the plate 110 is stacked on the first surface 120a of the frame 120, wherein the thermal fusion region 110b is overlapped with the frame 120, and the adhering region 110a is not overlapped with the frame 120 (step S604). As shown in FIG. 5B, the main shell 130 is adhered to the adhering region 110a of the plate 110 and the second surface 120b of the frame 120 (step S606). The thermal fusion region 110b is fixed to the frame 120 by thermal fusion (step S608), thereby completing the casing 100 shown in FIG. 1 and FIG. 2.

As described above, the casing 100 in the present embodiment mainly consists of the plate 110, the frame 120 and the main shell 130, wherein the adhering region 110a of the plate 110 is not overlapped with the frame 120, and the thermal fusion region 110b of the plate 110 is overlapped with the frame 120. Based on the above, the frame 120 and the adhering region 110a of the plate 110 may be fixed to the main shell 130 by adhesion, and in addition, the thermal fusion region 110b of the plate 110 may be fixed to the frame 120 by thermal fusion so as to provide the casing 100 with good structural strength. Instead of being manufactured by processing a single metal workpiece by means of a milling process that takes more time and effort, the casing 100 in the present embodiment is manufactured by combining the plate 110, the frame 120 with the main shell 130 in a composite process (including adhesion and thermal fusion) as described above. Therefore, the manufacturing of the casing 100 is effectively improved in processing speed and yield, thereby reducing the manufacturing cost and facilitating mass production of the casing 100.

In the present embodiment, the main shell 130 is made of, for example, aluminum or other metal materials. Moreover, the plate 110 and the frame 120 (such as a plastic piece) are covered by the main shell 130 as shown in FIG. 1. In other words, in the present embodiment, the main shell 130 made of metal is employed as an appearance of the casing 100, so that the casing 100 has a full metal appearance to meet design requirements.

Figure 6:
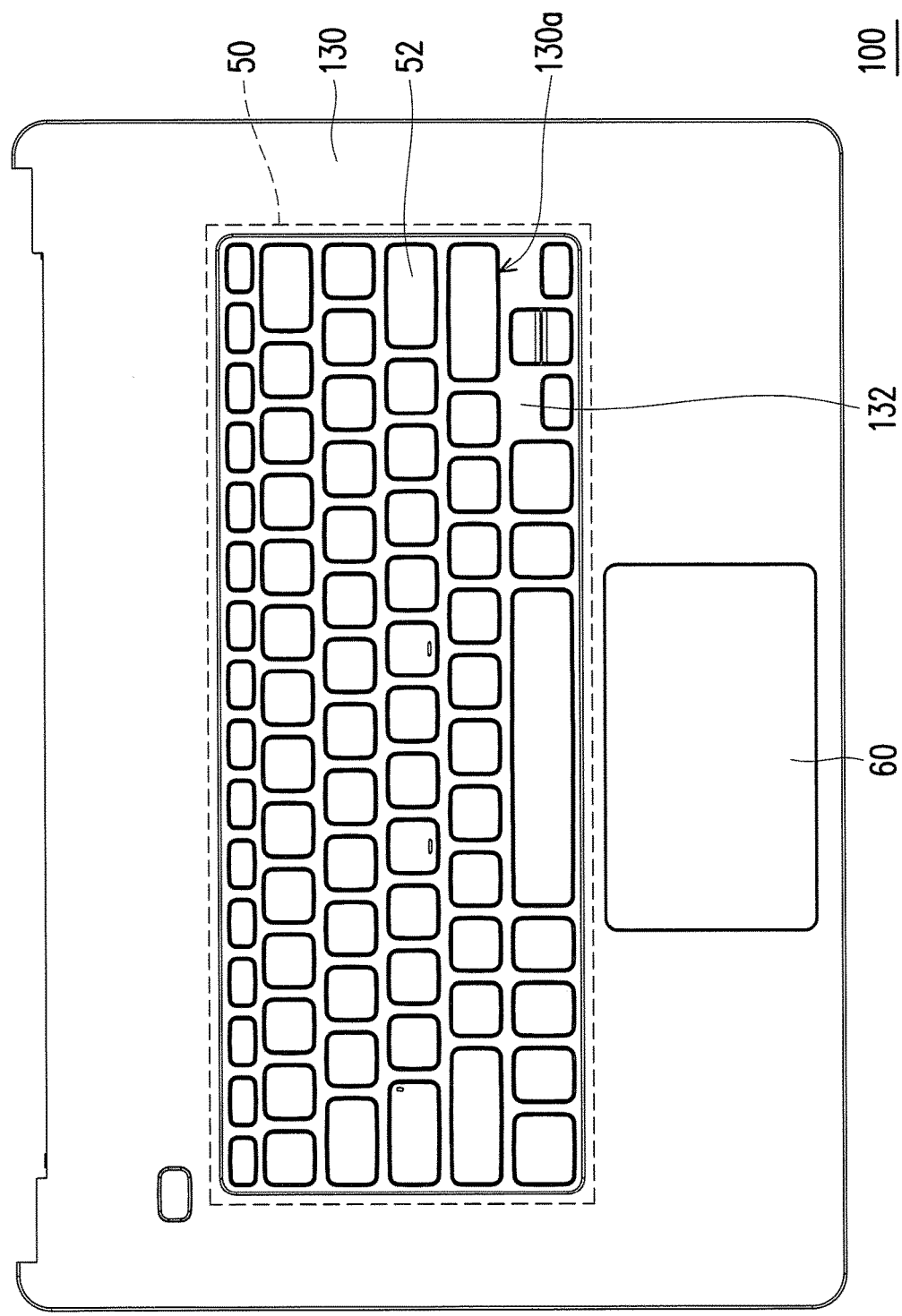
FIG. 6 is a schematic view illustrating an electronic module assembled to the casing in FIG. 1.
Figure 7:
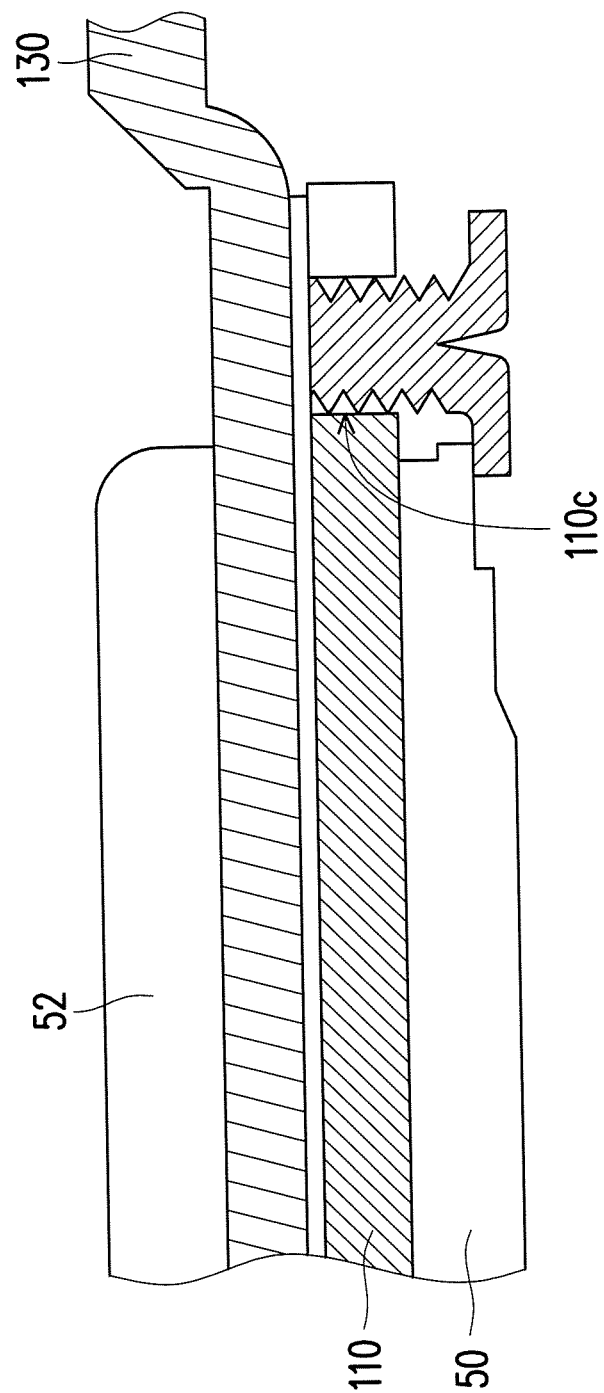
FIG. 7 is a partial cross-sectional view of the casing with the electronic module in FIG. 6.

FIG. 6 is a schematic view illustrating an electronic module assembled to the casing in FIG. 1. FIG. 7 is a partial cross-sectional view of the casing with the electronic module in FIG. 6. Please refer to FIG. 2, FIG. 6 and FIG. 7. The plate 110 in the present embodiment has a plurality of screw holes 110c. In the aforementioned manufacturing process, an electronic module 50 may be screwed to the plate 110 of the casing 100 via the screw holes 110c. In detail, the electronic module 50 is, for example, a keyboard, and has a plurality of keys 52. The plate 110 has a plurality of first openings 110d, and the main shell 130 has a plurality of second openings 130a. When the main shell 130 is adhered to the plate 110, the second openings 130a of the main shell 130 are aligned respectively with the first openings 110d of the plate 110. Moreover, when the electronic module 50 is screwed to the plate 110, the keys 52 are aligned respectively with the first openings 110d of the plate 110, so that the keys 52 are exposed by the first openings 110d and the second openings 130a to be pressed by a user. In addition, other types of electronic modules may also be fixed to the casing 100 via a part of the screw holes 110c. For example, a touch panel 60 shown in FIG. 6 may be fixed to the casing 100 via a part of the screw holes 110c.

Before the main shell 130 is adhered to the adhering region 110a as in step S606, a thickness of a portion 132 (denoted in FIG. 3 and FIG. 6) of the main shell 130 may be reduced by means of a milling process. The portion 132 corresponds to the adhering region 110a of the plate 110, and also corresponds to a position of the electronic module 50. Accordingly, in cases where the plate 100 has a fixed thickness, the thickness of the portion of the casing 100 corresponding to the electronic module 50 may be adjusted as needed to allow more flexibility in designing and manufacturing the casing 100.

Figure 8:
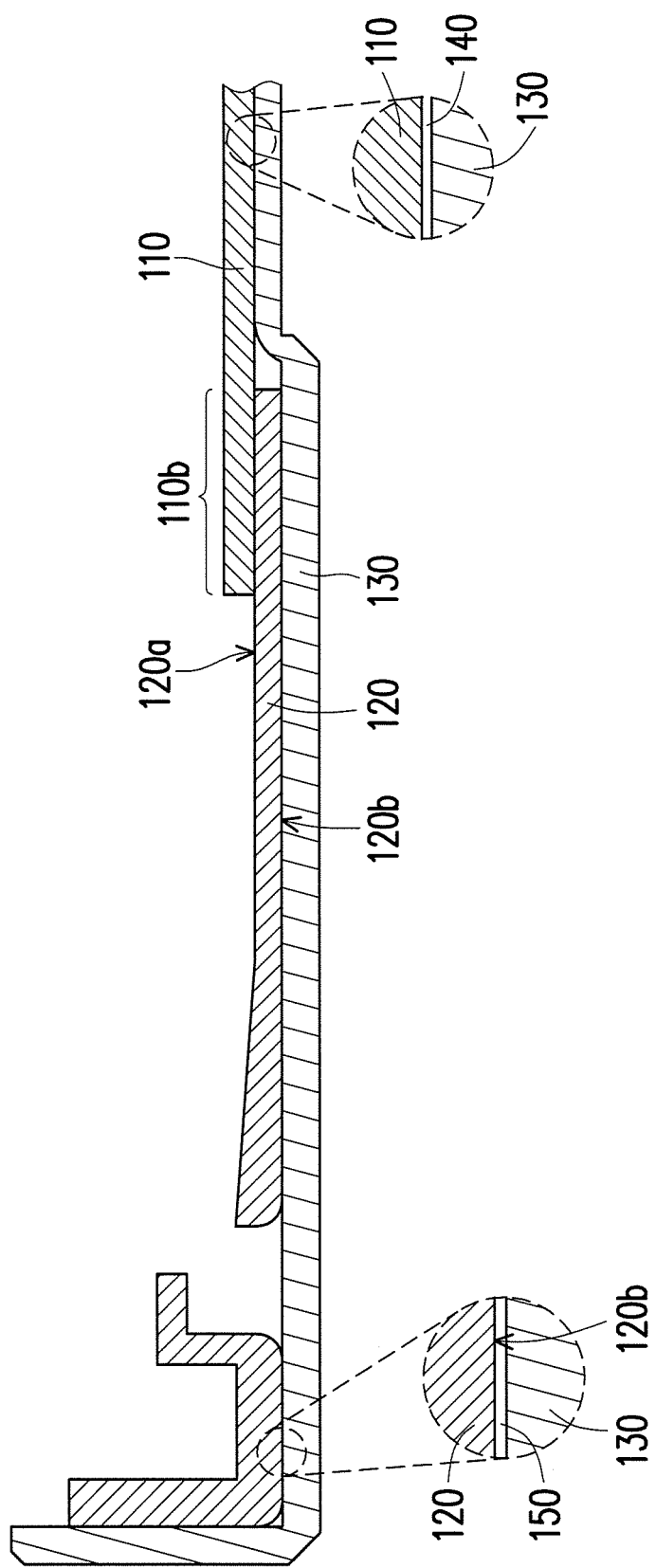
FIG. 8 is a partial cross-sectional view of the casing in FIG. 1.

FIG. 8 is a partial cross-sectional view of the casing in FIG. 1. Please refer to FIG. 3 and FIG. 8. In the process of adhering the main shell 130 to the adhering region 110a of the plate 110 and the second surface 120b of the frame 120 as in step S606, first, a first adhesive material 140 is provided on the adhering region 110a of the plate 110, and a second adhesive material 150 is provided on the main shell 130. Then, the plate 110 and the frame 120 are covered with the main shell 130, so that the first adhesive material 140 contacts the main shell 130 and the second adhesive material 150 contacts the second surface 120b of the frame 120. Next, thermal pressing is performed respectively to the plate 110, the frame 120 and the main shell 130, so that the plate 110 and the frame 120 are stably bonded to the main shell 130 respectively via the first adhesive material 140 and the second adhesive material 150 in a thermal pressing manner. The first adhesive material 140 after thermal pressing is adhered between the adhering region 110a and the main shell 130, while the second adhesive material 150 after thermal pressing is adhered between the second surface 120b of the frame 120 and the main shell 130. In the aforementioned manufacturing process, before the plate 110 is stacked on the frame 120, for example, the first adhesive material 140 may be coated on the adhering region 110a of the plate 110. In addition, before the plate 110 and the frame 120 are covered with the main shell 130, for example, the second adhesive material 150 may be provided on the main shell 130 in a dispensing manner.

Please refer to FIG. 3. In the present embodiment, the thermal fusion region 110b of the plate 110 has a plurality of apertures 110e, and the frame 120 has a plurality of thermal fusion bosses 120c. The thermal fusion bosses 120c are inserted respectively through the apertures 110e and are fixed to the plate 110 by thermal fusion. In detail, when the thermal fusion region 110b is fixed to the frame 120 by thermal fusion as in step S608, the thermal fusion bosses 120c of the frame 120 may be inserted respectively through the apertures 110e in the thermal fusion region 110b of the plate 110 as shown in FIG. 5A. Then, each of the thermal fusion bosses 120c is thermally fused so that the thermally fused thermal fusion bosses 120c are fixed to the plate 110, as shown in FIG. 2.

In summary, the casing of the invention mainly consists of the plate, the frame and the main shell, wherein the adhering region of the plate is not overlapped with the frame, and the thermal fusion region of the plate is overlapped with the frame. Based on the above, the frame and the adhering region of the plate may be fixed to the main shell by adhesion. Furthermore, the thermal fusion region of the plate may be fixed to the frame by thermal fusion so as to provide the casing with good structural strength. As described above, the casing of the invention is manufactured by combining the plate, the frame with the main shell in a composite process (including adhesion and thermal fusion) instead of using a milling process that takes more time and effort. Therefore, the manufacturing of the casing is effectively improved in processing speed and yield, thereby reducing the manufacturing cost and facilitating mass production of the casing. In addition, before the main shell is adhered to the adhering region of the plate, the thickness of the portion of the main shell corresponding to the adhering region may be reduced by means of a milling process. Thus, in cases where the plate has a fixed thickness, the thickness of the casing may be adjusted as needed to allow more flexibility in designing and manufacturing the casing.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A manufacturing method of a casing, comprising:
    providing a plate, a frame and a main shell, wherein the plate has an adhering region and at least one thermal fusion region, wherein the thermal fusion region is located at a periphery of the plate, the frame has a first surface and a second surface opposite to each other, the plate has a plurality of first openings, and the main shell has a plurality of second openings passing through the main shell;
    stacking the plate on the first surface of the frame, wherein the thermal fusion region is overlapped with the frame, and the adhering region is not overlapped with the frame;
    adhering the main shell to the adhering region of the plate and the second surface of the frame, wherein the step of adhering the main shell to the plate comprises aligning each of the second openings respectively with the corresponding first opening; and
    fixing the thermal fusion region to the frame by thermal fusion.

2. The manufacturing method of a casing as claimed in claim 1, wherein the plate has a plurality of screw holes, and the manufacturing method further comprises screwing an electronic module to the plate via the screw holes.

3. The manufacturing method of a casing as claimed in claim 2, wherein the electronic module is a keyboard having a plurality of keys, and the step of screwing the electronic module to the plate comprises aligning the keys respectively with the first openings.

4. The manufacturing method of a casing as claimed in claim 1, further comprising:
    reducing a thickness of a portion of the main shell before adhering the main shell to the adhering region, wherein the portion of the main shell corresponds to the adhering region.

5. The manufacturing method of a casing as claimed in claim 4, wherein the step of reducing the thickness of the portion of the main shell comprises a milling process.

6. The manufacturing method of a casing as claimed in claim 1, wherein the step of adhering the main shell to the adhering region of the plate and the second surface of the frame comprises:
    providing a first adhesive material on the adhering region;
    providing a second adhesive material on the main shell;
    covering the plate and the frame with the main shell so that the first adhesive material contacts the main shell and the second adhesive material contacts the second surface of the frame; and
    thermally pressing the plate and the frame to the main shell.

7. The manufacturing method of a casing as claimed in claim 6, wherein the step of providing the first adhesive material on the adhering region comprises:
    providing the first adhesive material on the adhering region before stacking the plate on the frame.

8. The manufacturing method of a casing as claimed in claim 1, wherein the thermal fusion region has a plurality of apertures, the frame has a plurality of thermal fusion bosses, and the step of fixing the thermal fusion region to the frame comprises:
    inserting the thermal fusion bosses respectively through the apertures; and
    thermally fusing each of the thermal fusion bosses when inserting the thermal fusion bosses respectively.

* * * * *